United States Patent [19]
Raatz et al.

[11] Patent Number: 5,546,355
[45] Date of Patent: Aug. 13, 1996

[54] INTEGRATED CIRCUIT MEMORY HAVING A SELF-TIMED WRITE PULSE INDEPENDENT OF CLOCK FREQUENCY AND DUTY CYCLE

[75] Inventors: Donovan L. Raatz; Taisheng Feng, both of Austin, Tex.

[73] Assignee: Motorola, Inc., Schaumburg, Ill.

[21] Appl. No.: 393,790

[22] Filed: Feb. 24, 1995

[51] Int. Cl.$^6$ ............................................. G11C 7/00
[52] U.S. Cl. ...................... 365/233; 365/191; 365/194; 365/189.01
[58] Field of Search .................. 365/230.01, 233, 365/191, 194, 189.01

[56] References Cited

U.S. PATENT DOCUMENTS 5,227,671  7/1993  Ehrlich ........................ 307/261
5,440,514  8/1995  Flannagan et al. ............ 365/194

*Primary Examiner*—Viet Q. Nguyen
*Attorney, Agent, or Firm*—Daniel D. Hill

[57] ABSTRACT

An integrated circuit memory (20) has a write pulse generator (38) for generating a self-timed write pulse independent of system clock frequency and system clock duty cycle. The write pulse generator (38) includes a delay element (56) and a delay element (68). The write pulse is triggered on a rising edge of the clock signal and has a duration that is determined by a delay time provided by the delay element (68). The delay elements (56, 68) provide single-sided delays and compensate for process, power supply, temperature variations of the integrated circuit memory (20).

20 Claims, 3 Drawing Sheets

5,546,355

INTEGRATED CIRCUIT MEMORY HAVING A SELF-TIMED WRITE PULSE INDEPENDENT OF CLOCK FREQUENCY AND DUTY CYCLE

FIELD OF THE INVENTION

This invention relates generally to memories, and more particularly, to a memory having a self-timed write pulse that is independent of clock frequency and duty cycle.

BACKGROUND OF THE INVENTION

A synchronous static random access memory (SRAM) is a type of integrated circuit memory that has latches for all inputs and outputs, good drive capability, and a self timed write cycle, all on a single monolithic integrated circuit. A synchronous SRAM is typically used as a high speed cache in a data processing system. When being used as a cache, the synchronous SRAM is under the control of a single system clock. The synchronous SRAM has several advantages over an asynchronous SRAM. First, the synchronous SRAM generally requires fewer external logic chips. Second, the synchronous SRAM can operate at higher system speeds than a comparable asynchronous memory. However, as the synchronous SRAM is required to operate at higher system clock frequencies, timing specifications become increasingly more difficult to meet.

In today's synchronous SRAMs, a write cycle may be accomplished in less than one clock cycle. A write pulse is generated in order to establish a window for the write cycle to occur. During the write pulse, a relatively large differential signal on the bit lines over-writes the contents of a selected memory cell. At the end of the write cycle, bit line equalization causes the voltages on the bit line pair to be close enough so that data is not overwritten and that the correct data can be sensed quickly during a following read cycle. If the bit lines are not equalized fast enough, incorrect data may be written in the selected memory cell on the next read cycle.

The write signal must be of sufficient duration to allow data to be written into a selected memory cell. Typically, the write pulse is dependent on the frequency and the duty cycle of the system clock signal. The write pulse is initiated on the rising edge of the clock signal and the duration of the write pulse is determined by the duty cycle of the clock signal. At very high clock frequencies, or very short duty cycles (clock high time), there may not be enough time to successfully write data to a selected memory cell and then equalize the bit lines. For example, a system clock frequency of 125 megahertz provides a clock cycle of only 8 nanoseconds. For a 50% duty cycle, only 4 nanoseconds are available in which to accomplish a write cycle. A minor fluctuation in the frequency or duty cycle of the clock signal may cause incorrect data to be written into the memory.

DESCRIPTION OF A PREFERRED EMBODIMENT

Generally, the present invention provides a synchronous integrated circuit memory having a write pulse generator for generating a self-timed write pulse that is independent of clock frequency and clock duty cycle. The write pulse is triggered on the rising edge of a system clock signal and has a duration that is determined by a delay time provided by control logic and two single-sided delay elements. The write pulse generator permits the integrated circuit memory to operate with high clock signal frequencies. Also, the write pulse generator allows the integrated circuit memory to operate with clock signals having relatively short duty cycles. In addition, the delay elements compensate for temperature, power supply, and process variations of the integrated circuit memory.

Figure 1:
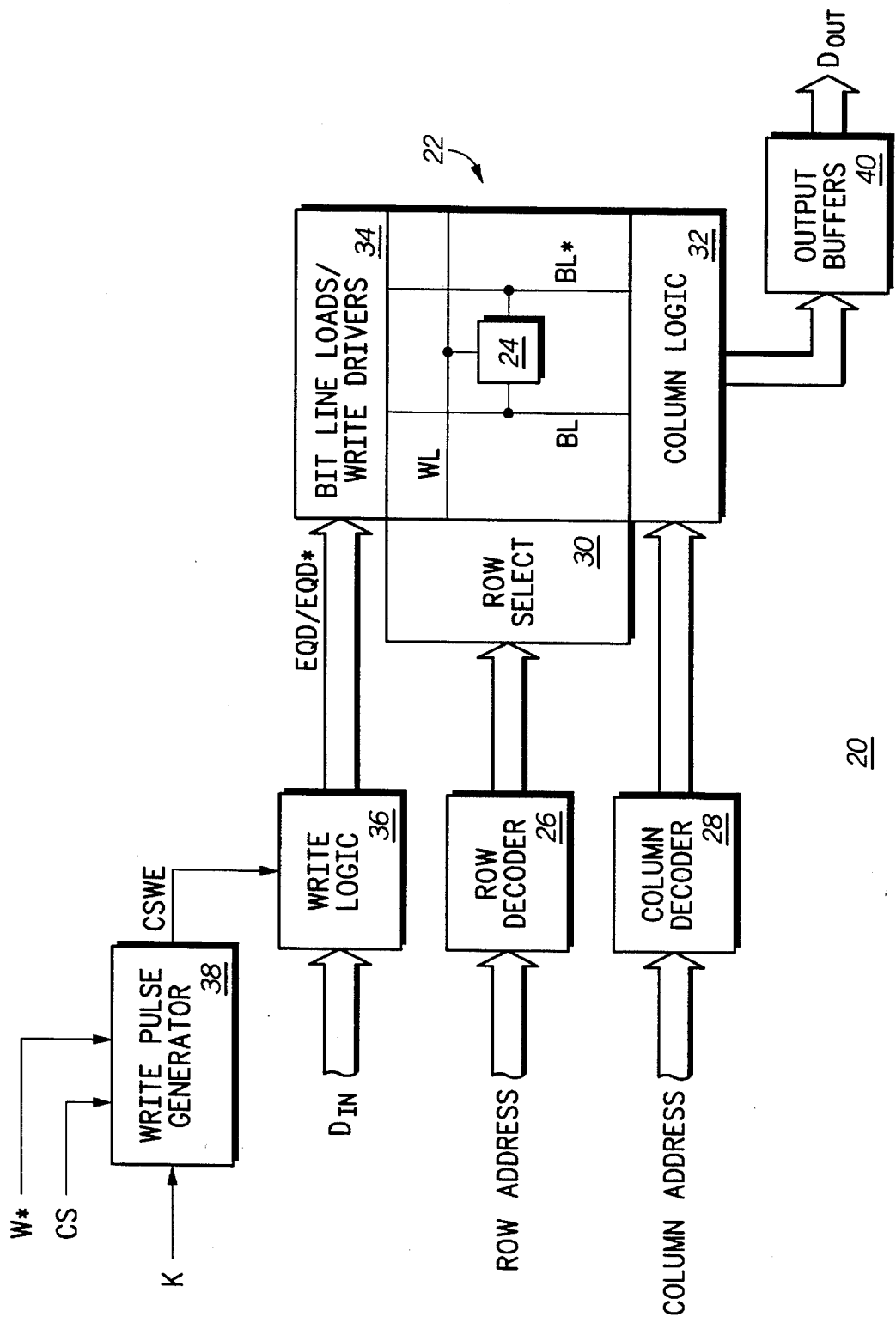
FIG. 1 illustrates, in block diagram form, a memory in accordance with the present invention.

The present invention can be more fully described with reference to FIGS. 1–4. FIG. 1 illustrates, in block diagram form, integrated circuit memory 20 in accordance with the present invention. Memory 20 includes memory array 22, row decoder 26, column decoder 28, row select 30, column logic 32, bit line loads/write drivers 34, write logic 36, write pulse generator 38, and output buffers 40. Memory array 22 includes an array of static random access memory (SRAM) cells. Each memory cell is coupled to a bit line pair and to a word line. A representative memory cell 24 is shown coupled to a bit line pair labeled "BL" and "BL*" and to a word line labeled "WL".

Row decoder 26 receives a plurality of address signals labeled "ROW ADDRESS", and column decoder 28 receives a plurality of address signals labeled "COLUMN ADDRESS", Row decoder 26 and column decoder 28 each provides a plurality of decoded address signals to row select 30 and column logic 32, respectively. In response to receiving the decoded address signals, row select 30 selects a word line in memory array 22, and column logic 32 selects a bit line pair. A memory cell located at the intersection of the word line and the bit line pair receives data via the bit line pair during a write cycle, or provides data to the bit line pair during a read cycle. Note that the particular address signals received by row decoder 26 and column decoder 28 have no special significance and may be different in other embodiments. Also, the amount of decoding performed by row decoder 26 and column decoder 28 is not important for describing the invention and may be different in other embodiments.

During a read cycle of memory 20, a write enable signal labeled "W*" and a chip select signal labeled "CS" are each asserted as a logic high and provided to write pulse generator 38. Write pulse generator 38 is coupled to write logic 36 and provides a self-timed write pulse labeled "CSWE" to write logic 36 in response to write enable signal W*, chip select signal CS, and a clock signal labeled "K". Write enable signal W*, chip select signal CS, and clock signal K are typically externally generated by a data processor (not shown). Row address signals ROW ADDRESS are provided to row decoder 26 and column address signals COLUMN ADDRESS are provided to column decoder 28 to select a memory cell to be read, for example memory cell 24. Data is provided by memory cell 24 to bit line pair BL/BL*, in the form of a differential voltage between the bit lines of the bit line pair. Sense amplifiers in column logic 32 senses and amplifies the differential voltage and provides the differential voltage to output buffers 40. Data signals $D_{OUT}$ are provided to output terminals (not shown) that correspond to data stored in the selected memory cell. The number of data signals provided for a particular address, or data organization, is not significant and may be different in other embodiments.

During a write cycle of memory 20, write enable signal W* is asserted as a logic low, and chip select signal CS is asserted as a logic high. Row address signals ROW ADDRESS are provided to row decoder 26 and column address signals COLUMN ADDRESS are provided to column decoder 28 to select a memory cell to be written to, for example memory cell 24. Single-ended data signals labeled "$D_{IN}$" are provided to write logic 36. Write logic 36 includes data buffers and latches. Write pulse CSWE is asserted as a logic high on a rising edge of clock signal K by write pulse generator 38. During the time that write pulse CSWE is a logic high, differential data signals, labeled "EQD/EQD*", corresponding to data in signals $D_{IN}$, are provided to bit line loads/write drivers 34. A selected bit line pair, for example bit line pair BL/BL*, receives the differential data signals in the form of a differential voltage, and provides the differential voltage to a memory cell that is coupled to the selected word line and bit line pair. The differential voltage provided to the bit line pair is large enough to overwrite, if necessary, the data stored in the selected memory cell. Following the write cycle, the bit line loads equalize the differential voltage on the bit line pairs in preparation for a read cycle.

At high clock frequencies, a minor variation in duty cycle or frequency may cause erroneous data to be written to memory array 22. Write pulse generator 38 provides write pulse CSWE independent of the frequency or duty cycle of clock signal K. The write pulse is triggered by an edge of clock signal K, and has a duration determined by a delay element for providing a predetermined delay. The operation of write pulse generator 38 will be described in more detail in the discussion of FIG. 2 and FIG. 3.

Figure 2:
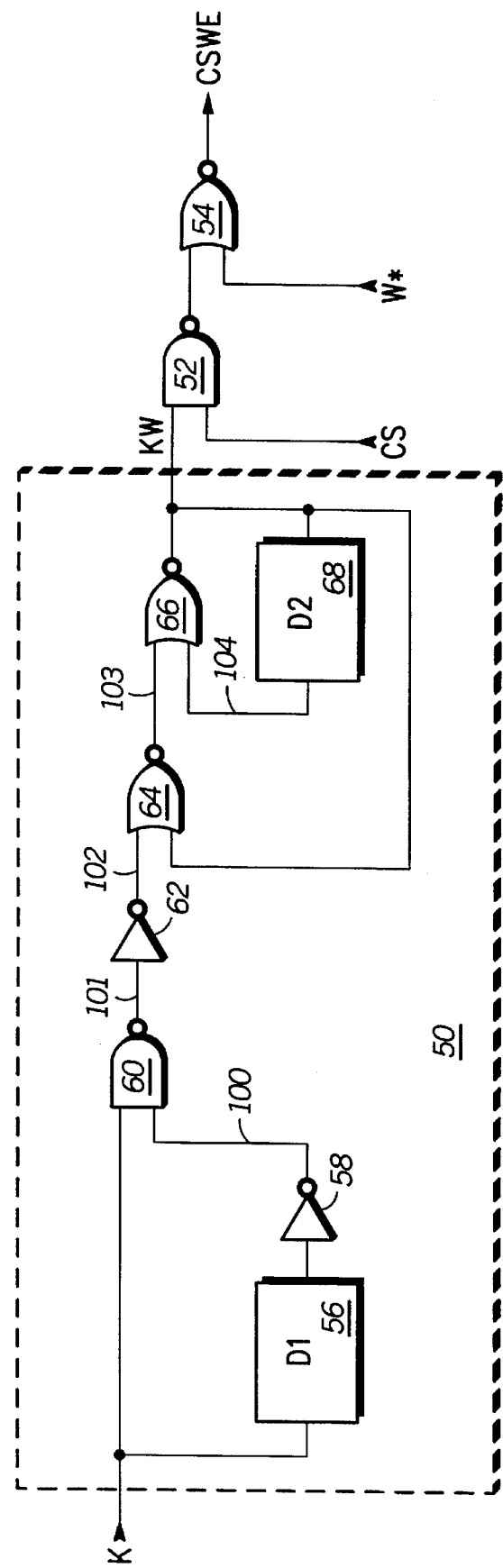
FIG. 2 illustrates, in partial logic diagram form and partial block diagram form, the write pulse generator of the memory of FIG. 1.

FIG. 2 illustrates, in partial logic diagram form and partial block diagram form, write pulse generator 38 of memory 20 of FIG. 1. Write pulse generator 38 includes self-timed write pulse circuit 50, NAND logic gate 52, and NOR logic gate 54. Self-timed write pulse circuit 50 includes single-sided delay elements 56 and 68, inverters 58 and 62, NAND logic gate 60, and NOR logic gates 64 and 66.

Delay element 56 has an input terminal for receiving clock signal K, and an output terminal. Delay element 56 provides a predetermined delay time labeled "D1" and is illustrated in more detail in FIG. 4. Inverter 58 has an input terminal connected to the output terminal of delay element 56, and an output terminal for providing a signal labeled "100". NAND logic gate 60 has a first input terminal for receiving clock signal K, a second input terminal coupled to the output terminal of delay element 56, and an output terminal for providing a signal labeled "101". Inverter 62 has an input terminal connected to the output terminal of NAND logic gate 60, and an output terminal for providing a signal labeled "102". NOR logic gate 64 has a first input terminal connected to the output terminal of inverter 62, a second input terminal, and an output terminal for providing a signal labeled "103". NOR logic gate 66 has a first input terminal connected to the output terminal of NOR logic gate 64, a second input terminal, and an output terminal coupled to the second input terminal of NOR logic gate 64 for providing a signal labeled "KW". Delay element 68 has an input terminal connected to the output terminal of NOR logic gate 66, and an output terminal connected to the input terminal of NOR logic gate 66 for providing a signal labeled "104". Delay element 68 provides a predetermined delay time labeled "D2".

NAND logic gate 52 has a first input terminal connected to the output terminal of NOR logic gate 66, a second input terminal for receiving chip select signal CS, and an output terminal. NOR logic gate 54 has a first input terminal connected to the output terminal of NAND logic gate 52, a second input terminal for receiving write enable signal W* and an output terminal for providing write pulse CSWE. Note that an asterisk (*) after a signal name illustrates that the signal is a logical complement of a signal having the same name but lacking the asterisk (*). Also, note that each of the logic gates represents a logic operation rather than a single logic gate.

Figure 3:
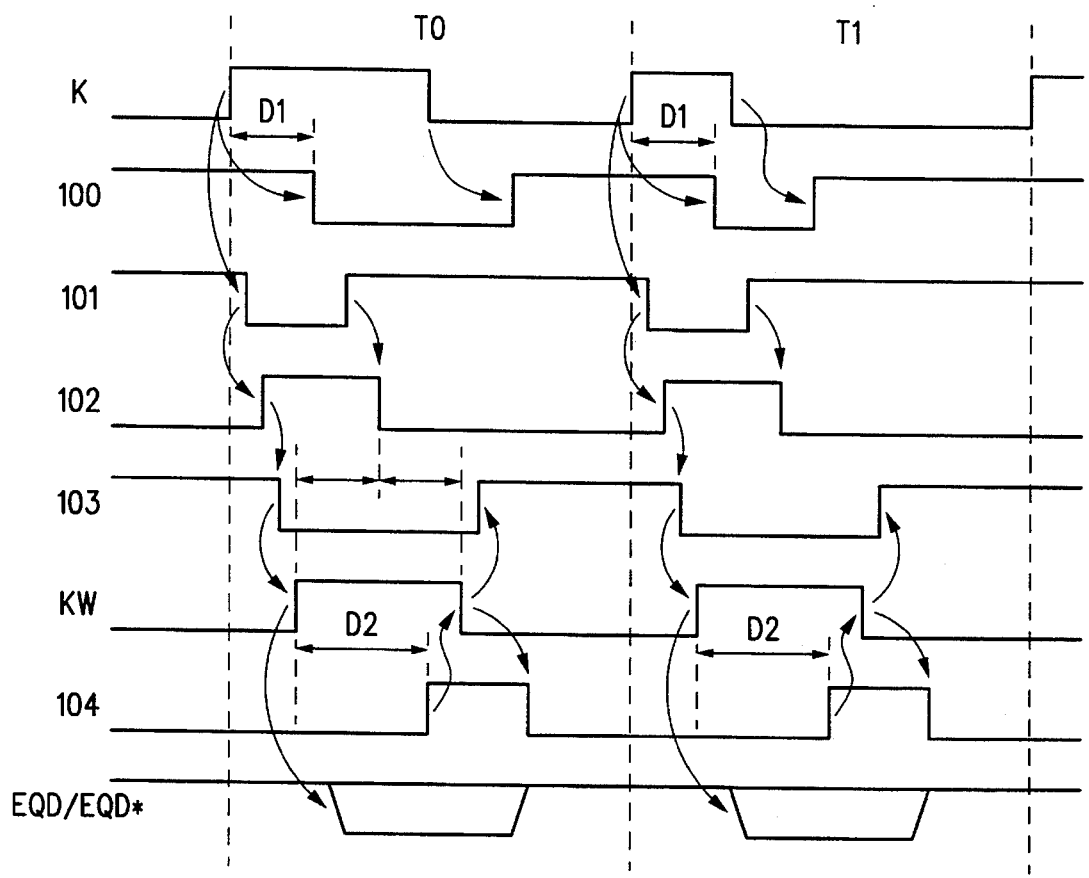
FIG. 3 illustrates a timing diagram of various signals of the memory of FIG. 1.

FIG. 3 illustrates a timing diagram of various signals of write pulse generator 38 of FIG. 2. Note that the timing diagram of FIG. 3 is not drawn to scale and does not represent relative voltage levels of the various signals. Also, note that the clock signal is divided into cycles, and each cycle is labeled uniquely by "T" followed by a number. Two cycles of clock signal K, labeled "T0" and "T1", are illustrated in FIG. 3. Clock cycle T0 illustrates a clock cycle where the duty cycle is equal to about 50%. Clock cycle T1 illustrates a clock cycle having a duty cycle that is less than 50%.

Referring to both FIG. 2 and FIG. 3, the beginning of clock cycle T0 occurs when clock signal K transitions to a logic high. Signal 100 transitions to a logic low after the predetermined delay D1 provided by delay element 56 and by inverter 58. Signal 101 from the output terminal of NAND logic gate 60 transitions to a logic low in response to clock signal K transitioning to a logic high. Signal 102 transitions to a logic high in response to signal 101 transitioning to a logic low. Signal 103 transitions to a logic low in response to signal 102 transitioning to a logic high. Signal KW transitions to a logic high in response to signal 103 transitioning to a logic low. If chip select signal CS is a logic high, and write enable signal W* is a logic low, indicating a write cycle, write pulse CSWE will be provided as a logic high to write logic 36. Differential data signals EQD/EQD* are provided to a selected memory cell in memory array 22 in response to, and during-the time that write pulse CSWE is a logic high. The duration of CSWE is approximately the same as the duration of signal KW.

After delay time D1 has expired, signal 100 transitions to a logic low, causing signal 101 to transition to a logic high. Signal 102 transitions to a logic low in response to signal 101. Signal 103 does not transition to a logic high until signal KW becomes a logic low and is fed back to the second input terminal of NOR logic gate 64. Signal 103 cannot return to a logic high until signal KW transitions to a logic low. Signal KW does not return to a logic low until after predetermined delay D2 provided by delay element 68. After delay time D2 has expired, signal 104 transitions to a logic high and is provided to the second input terminal of NOR logic gate 66. Signal KW then returns to a logic low, ending the write pulse, and allowing signal 103 to return to a logic high in response to signal 102 and signal KW both being a logic low. Signal 104 then transitions to a logic low in response to signal KW transitioning to a logic low. The duration of signal KW is determined by the length of delay time D2. Delay time D1 ensures that signal 101 stays low long enough for signal KW to transition to a logic high. In a preferred embodiment, delay time D1 is equal to about one-half of delay time D2 so that signal 102 transitions to a logic low approximately at the midpoint of the logic low time of signal 103. This increases the margins of write pulse generator 38. In other embodiments, delay time D1 may be different than one-half of delay time D2.

During clock cycle T1, as stated above, the duty cycle of clock signal K is less than 50%. The beginning of clock cycle T1 occurs when clock signal K transitions to a logic high. Write pulse circuit 50 operates the same as during clock cycle T0, independent of the duty cycle or frequency of clock signal K. Signal 100 transitions to a logic low after the predetermined delay D1 provided by delay element 56 and by inverter 58. Signal 101, from the output terminal of NAND logic gate 60, transitions to a logic low in response to clock signal K transitioning to a logic high. Signal 102 transitions to a logic high in response to signal 101 transitioning to a logic low. Signal 103 transitions to a logic low in response to signal 102 transitioning to a logic high. Signal KW transitions to a logic high in response to signal 103 transitioning to a logic low. If chip select signal CS is a logic high, and write enable signal W* is a logic low, indicating a write cycle, write pulse CSWE will be provided as a logic high to write logic 36. Differential data signals EQD/EQD* are provided to a selected memory cell in memory array 22 in response to, and during the time that write pulse CSWE is a logic high. As described above for clock cycle T0, the duration of CSWE is approximately the same as the duration of signal KW.

After delay time D1 has expired, signal 100 transitions to a logic low, causing signal 101 to transition to a logic high. Signal 102 transitions to a logic low. Signal 103 does not transition to a logic high until signal KW becomes a logic low and is fed back to the second input terminal of NOR logic gate 64. Signal 103 cannot return to a logic high until signal KW transitions to a logic low. Signal KW cannot return to a logic low until after predetermined delay time D2, provided by delay element 68, has expired. After delay time D2 has expired, signal 104 transitions to a logic high and is provided to the second input terminal of NOR logic gate 66. Signal KW then returns to a logic low, ending the write pulse, and allowing signal 103 to return to a logic high in response to signal 102 and signal KW each being a logic low. Signal 104 then transitions to a logic low in response to signal KW transitioning to a logic low. The duration of signal KW is determined by the length of delay time D2 and does not depend on the duty cycle of clock signal K, as illustrated in FIG. 3.

Figure 4:
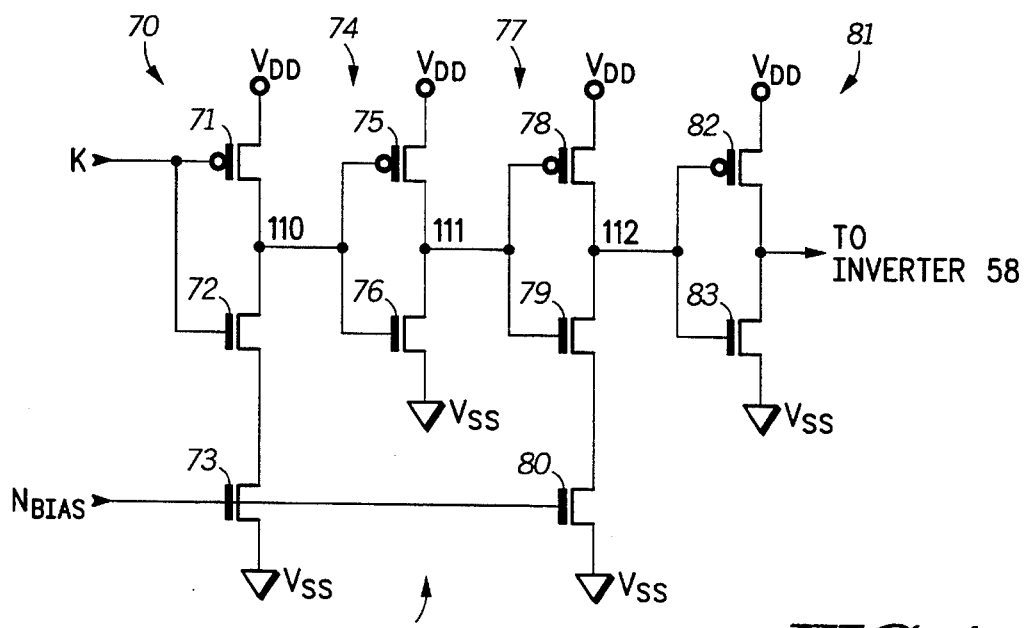
FIG. 4 illustrates, is schematic diagram form, a delay element of the write pulse generator of FIG. 2.

FIG. 4 illustrates, in schematic diagram form, single-sided delay element 56 of write pulse generator 38 of FIG. 2. Delay element 56 includes series-connected inverters 70, 74, 77, and 81, and N-channel transistors 73 and 80. Inverter 70 includes P-channel transistor 71 and N-channel transistor 72. Inverter 74 includes P-channel transistor 75 and N-channel transistor 76. Inverter 77 includes P-channel transistor 78 and N-channel transistor 79. Inverter 81 includes P-channel transistor 82 and N-channel transistor 83. An output terminal of inverter 70 is connected to an input terminal of inverter 74 at node 110, an output terminal of inverter 74 is connected to an input terminal of inverter 77 at node 111, and an output terminal of inverter 77 is connected to an input terminal of inverter 81 at node 112. An output terminal of inverter 81 is connected to the input terminal of inverter 58 (FIG. 2).

Also, N-channel transistor 73 has a drain connected to a source of N-channel transistor 72, a gate for receiving a bias voltage labeled "$N_{BIAS}$", and a source connected to a power supply voltage labeled "$V_{SS}$". N-channel transistor 80 has a drain connected to a source of N-channel transistor 79, a gate for receiving bias voltage $N_{BIAS}$, and a source connected to power supply voltage $V_{SS}$. N-channel transistors 73 and 80 are used to provide the single-sided delay, where the single-sided delay occurs when clock signal K transitions from a logic low voltage to a logic high voltage.

When clock signal K transitions from a logic low voltage to a logic high voltage, bias voltage $N_{BIAS}$ regulates the low to high transition of clock signal K to minimize process, power supply, and temperature variations. P-channel transistor 71 becomes substantially non-conductive and N-channel transistor 72 becomes conductive. A voltage at node 110 is decreased to a logic low voltage through N-channel transistors 72 and 73. The logic low voltage at node 110 is provided to the gates of P-channel transistor 75 and N-channel transistor 76, causing a logic high voltage at node 111. The logic high voltage causes N-channel transistor 79 to become conductive, and P-channel transistor 78 to become non-conductive. A voltage at node 112 is reduced to a logic low voltage through N-channel transistor 80. Inverter 81 then provides a logic high voltage to the input terminal of inverter 58.

N-channel transistors 73 and 80 have no effect on the rise time of nodes 110 and 112 when clock signal K transitions from a logic high voltage to a logic low voltage, thus providing the single-sided delay.

Delay element 68 provides a single-sided delay using a circuit similar to the delay element 56, however, delay element 68 includes more series connected inverters to increase the delay time D2 so that D2 is about twice as long as delay time D1.

Write pulse generator 38 permits memory 20 to operate with higher clock signal frequencies. Also, the write pulse generator allows memory 20 to operate with clock signals having relatively short duty cycles (less than 4 nanoseconds duration). In addition, bias voltage $N_{BIAS}$ is used in delay elements 56 and 68 to compensate for temperature, supply voltage, and process variations.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An integrated circuit memory, comprising:

a plurality of memory cells, a memory cell of the plurality of memory cells coupled to a bit line and to a word line;

a write logic circuit, coupled to the plurality of memory cells, for providing a data signal to the bit line in response to a write pulse, the data signal corresponding to input data; and a write pulse circuit, coupled to the write logic circuit, for providing the write pulse during a write cycle of the integrated circuit memory, the write pulse being triggered by an edge of an input clock signal, and the write pulse having a duration determined by a predetermined delay, wherein the duration of the write pulse is independent of the input clock signal duty cycle and frequency.

2. The integrated circuit memory of claim 1, wherein the write pulse circuit comprises:

a first logic gate having a first input terminal for receiving the input clock signal, a second input terminal, and an output terminal;

a first delay element having an input terminal for receiving the input clock signal, and an output terminal;

a first inverter having an input terminal coupled to the output terminal of the first delay element, and an output terminal coupled to the second input terminal of the first logic gate;

a second inverter having an input terminal coupled to the output terminal of the first logic gate, and an output terminal;

a second logic gate having a first input terminal coupled to the output terminal of the second inverter, a second input terminal, and an output terminal;

a third logic gate having a first input terminal coupled to the output terminal of the second logic gate, a second input terminal, and an output terminal coupled to the second input terminal of the second logic gate; and a second delay element having an input terminal coupled to the output terminal of the third logic gate, and an output terminal coupled to the second input terminal of the third logic gate.

3. The integrated circuit memory of claim 2, wherein the predetermined delay is determined by a delay provided by the second delay element.

4. The integrated circuit memory of claim 2, wherein the first delay element provides a first delay time and the second delay element provides a second delay time, the first delay time equal to about one-half of the second delay time.

5. The integrated circuit memory of claim 2, wherein the first and second delay elements are characterized as being single-sided delay elements.

6. The integrated circuit memory of claim 2, wherein the first logic gate provides a logical NAND function and the second and third logic gates provide a logical NOR function.

7. An integrated circuit memory, comprising:

a plurality of memory cells, a memory cell of the plurality of memory cells coupled to a bit line and to a word line;

a write logic circuit, coupled to the plurality of memory cells, for providing a data signal to the bit line in response to a write pulse, the data signal corresponding to input data; and a write pulse generator, coupled to the write logic circuit, the write pulse generator receiving a clock signal and a write enable signal of a predetermined logic state, and in response, the write pulse generator providing the write pulse during a write cycle of the integrated circuit memory, the write pulse being triggered by a rising edge of the clock signal, and the write pulse having a duration determined by a predetermined delay, wherein the duration of the write pulse is independent of the input clock signal duty cycle and frequency.

8. The integrated circuit memory of claim 7, wherein the plurality of memory cells are characterized as being a plurality of static random access memory cells.

9. The integrated circuit memory of claim 7, wherein the write pulse generator comprises:

a first logic gate having a first input terminal for receiving the clock signal, a second input terminal, and an output terminal;

a first delay element having an input terminal for receiving the clock signal, and an output terminal;

a first inverter having an input terminal coupled to the output terminal of the first delay element, and an output terminal coupled to the second input terminal of the first logic gate;

a second inverter having an input terminal coupled to the output terminal of the first logic gate, and an output terminal;

a second logic gate having a first input terminal coupled to the output terminal of the second inverter, a second input terminal, and an output terminal;

a third logic gate having a first input terminal coupled to the output terminal of the second logic gate, a second input terminal, and an output terminal coupled to the second input terminal of the second logic gate; and a second delay element having an input terminal coupled to the output terminal of the third logic gate, and an output terminal coupled to the second input terminal of the third logic gate.

10. The integrated circuit memory of claim 9, wherein the predetermined delay is determined by the second delay element.

11. The integrated circuit memory of claim 9, wherein the first delay element provides a first delay time and the second delay element provides a second delay time, the first delay time equal to about one-half of the second delay time.

12. The integrated circuit memory of claim 9, wherein the first and second delay elements are characterized as being single-sided delay elements.

13. The integrated circuit memory of claim 9, wherein the first logic gate provides a logical NAND function and the second and third logic gates provide a logical NOR function.

14. The integrated circuit memory of claim 9, further comprising:

a fourth logic gate having a first input terminal coupled to the output terminal of the third logic gate, a second input terminal for receiving a chip select signal, and an output terminal; and a fifth logic gate having a first input terminal coupled to the output terminal of the fourth logic gate, a second input terminal for receiving a write enable signal, and an output terminal coupled to the write logic circuit.

15. An integrated circuit memory, comprising:

a plurality of memory cells, a memory cell of the plurality of memory cells coupled to a bit line and to a word line;

a write logic circuit, coupled to the plurality of memory cells, for providing a data signal to the bit line in response to a write pulse, the data signal corresponding to input data; and a write pulse generator coupled to the write logic circuit, the write pulse generator comprising:

a first logic gate having a first input terminal for receiving an input clock signal, a second input terminal, and an output terminal;

a first delay element having an input terminal for receiving the input clock signal, and an output terminal;

a first inverter having an input terminal coupled to the output terminal of the first delay element, and an output terminal coupled to the second input terminal of the first logic gate;

a second inverter having an input terminal coupled to the output terminal of the first logic gate, and an output terminal;

a second logic gate having a first input terminal coupled to the output terminal of the second inverter, a second input terminal, and an output terminal;

a third logic gate having a first input terminal coupled to the output terminal of the second logic gate, a second input terminal, and an output terminal coupled to the second input terminal of the second logic gate for providing the write pulse; and a second delay element having an input terminal coupled to the output terminal of the third logic gate, and an output terminal coupled to the second input terminal of the third logic gate.

16. The integrated circuit memory of claim 15, further comprising a fourth logic gate having a first input-terminal coupled to the output terminal of the third logic gate, a second input terminal for receiving a chip select signal, and an output terminal.

17. The integrated circuit memory of claim 16, further comprising a fifth logic gate having a first input terminal coupled to the output terminal of the fourth logic gate, a second input terminal for receiving a write enable signal, and an output terminal coupled to the write logic circuit.

18. The integrated circuit memory of claim 15, wherein the first and second delay elements are characterized as being single-sided delay elements.

19. The integrated circuit memory of claim 15, wherein the first delay element provides a first delay time and the second delay element provides a second delay time, the first delay time equal to about one-half of the second delay time.

20. The integrated circuit memory of claim 15, further comprising:

a fourth logic gate having a first input terminal coupled to the output terminal of the third logic gate, a second input terminal for receiving a chip select signal, and an output terminal; and a fifth logic gate having a first input terminal coupled to the output terminal of the fourth logic gate, a second input terminal for receiving a write enable signal, and an output terminal coupled to the write logic circuit.

* * * * *